US012783752B2

(12) United States Patent
Ghobad et al.

(10) Patent No.: US 12,783,752 B2
(45) Date of Patent: Nov. 3, 2026

(54) AUTOMATED CALIBRATION OF BUILDING ENERGY MODELS

(71) Applicant: ENERlite Consulting, Inc., Sacremento, CA (US)

(72) Inventors: Ladan Ghobad, Sacramento, CA (US); Peng Yin, Lafayette, LA (US)

(73) Assignee: ENERlite Consulting, Inc., Sacremento, CA (US)

( * ) Notice: Subject to any disclaimer, the term of this patent is extended or adjusted under 35 U.S.C. 154(b) by 940 days.

(21) Appl. No.: 18/166,011

(22) Filed: Feb. 8, 2023

(65) Prior Publication Data

US 2024/0265167 A1 Aug. 8, 2024

(51) Int. Cl.
*G06F 30/20* (2020.01)
*G06F 30/12* (2020.01)

(52) U.S. Cl.
CPC .............. *G06F 30/20* (2020.01); *G06F 30/12* (2020.01)

(58) Field of Classification Search
CPC .......... G06F 30/00; G06F 30/20; G06F 30/12; G06F 2119/06; G06F 30/13
USPC .............................................................. 703/1
See application file for complete search history.

(56) References Cited

U.S. PATENT DOCUMENTS 6,134,511 A 10/2000 Subbarao
10,460,049 B2 10/2019 Sons et al.
2013/0297240 A1* 11/2013 Dutton ..................... G01D 4/00 702/61
2014/0129197 A1* 5/2014 Sons ....................... G06F 30/13 703/7
2014/0222394 A1* 8/2014 Drees ..................... G05B 13/04 703/2
2017/0300599 A1 10/2017 Becerik-Gerber et al.

FOREIGN PATENT DOCUMENTS

GB 2584614 A * 12/2020 ............. G06F 30/27
WO 2014085777 A1 6/2014

* cited by examiner

Primary Examiner — Cedric Johnson
(74) *Attorney, Agent, or Firm* — Scale LLP

(57) ABSTRACT

In some embodiments, a system for automated calibration of building energy models may be configured to obtain a first building energy model for a building, generate plurality of sensitivity values by determining, for each of the plurality of variables, a respective sensitivity value that indicates a sensitivity of an output of the first building energy model to variations in the respective variable. The system may be further configured to, based on the plurality of variables and the plurality of sensitivity values, generate a second building energy model for the building. The second building energy model may include the plurality of variables and may be more computationally efficient than the first building energy model. The system may be configured to tune the second building energy model by modifying one or more of the plurality of variables based on historical energy consumption data for the building.

18 Claims, 13 Drawing Sheets

Pre- and post-calibration comparison for electricity

Monthly Electricity Consumption [MWh] for 3 years

Representative year (e.g., for use in calibration)

FIG. 6

| | | Variables | | | | | | | |
|---|---|---|---|---|---|---|---|---|---|
| | | Roof Thermal Resistance | Glazing SHGC | Cooling COP | Walls Thermal Resistance | Glazing Solar Reflectance | Occupancy Zone Floor Area per Person | LPD Watts per Zone Floor Area | EPD Power per Zone Floor Area |
| Unit | | m2-K/W | - | - | m2-K/W | - | m2/person | W/m2 | W/m2 |
| *Range* | *Min* | *3.5* | *0.20* | *2.0* | *1.8* | *0.10* | *1* | *11.83* | *8.91* |
| | *Max* | *8.8* | *0.90* | *8.0* | *4.4* | *0.90* | *20* | *21.97* | *13.99* |
| Original Value | | 0.25 | 0.73 | 3.5 | 0.9 | 0.75 | 6 | 5 | 5 |
| Calibrated Solution 1 | | 0.10 | 0.86 | 4.00 | 0.53 | 0.40 | 5.00 | 5.16 | 7.51 |
| Calibrated Solution 2 | | | | | | | | | |
| Calibrated Solution 3 | | | | | | | | | |

● ● ●

| Performance Indexes | | | | |
|---|---|---|---|---|
| CV(RMSE) | NMBE | GOF Annual Electricity | GOF Annual Gas | GOF Annual Total Energy |
| | | | | |
| | | | | |
| | | | | |
| | | | | |

● ● ●

FIG. 7A

| | Measurement (Baseline) | | | Second Energy Model (Metamodel) | | | Third Energy Model (EnergyPlus) | | |
|---|---|---|---|---|---|---|---|---|---|
| | Electricity | Heating | Cooling | Electricity | Heating | Cooling | Electricity | Heating | Cooling |
| Nov | 63110 | 510500 | 69366 | 65968 | 487144 | 73448 | 67000 | 498037 | 75828 |
| Dec | 49577 | 300580 | 40183 | 53390 | 312993 | 38433 | 54451 | 317801 | 39741 |
| Jan | 53121 | 488710 | 62376 | 54586 | 487045 | 59076 | 55647 | 497272 | 61061 |
| Feb | 55607 | 468247 | 39830 | 55738 | 469476 | 40156 | 56705 | 476778 | 41820 |
| Mar | 62022 | 536257 | 72268 | 65267 | 536172 | 65380 | 66343 | 546843 | 67672 |
| Apr | 54052 | 527067 | 73603 | 54649 | 515317 | 71516 | 55536 | 529241 | 73838 |

Comparison of heating energy

Comparison of cooling energy

Comparison of electricity consumption

Pre- and post-calibration comparison for heating energy

Pre- and post-calibration comparison for cooling energy

Pre- and post-calibration comparison for electricity

AUTOMATED CALIBRATION OF BUILDING ENERGY MODELS

GOVERNMENT FUNDING STATEMENT

This material is based upon work supported by the U.S. Department of Energy Office of Science Financial Assistance Program under Award Number DE-SC0021726.

FIELD OF THE DISCLOSURE

This disclosure relates to generating and calibrating building energy models. More specifically, this disclosure relates to systems and methods that automatically identify and adjust building energy model parameters based on machine learning to match the historical energy use data. The calibrated model can predict future building energy consumption and estimate energy savings of proposed retrofits more accurately.

BACKGROUND

Building energy modeling physics-based simulations generally take multiple inputs related to a building including geometry, construction materials, lighting, heating, ventilation, and air conditioning (HVAC), refrigeration, water heating, renewable generation system configurations, component efficiencies, and control strategies. These simulations may also take descriptions of the building's use and operation including schedules for occupancy, lighting, plug-loads, and thermostat settings. Building energy models are increasingly used in building industries for variety of purposes, such as code compliance evaluation for new construction, continuous commissioning for existing buildings, and savings quantification of energy efficiency projects to meet local code requirements and goals. Building energy models without proper validation and calibration lead to significant discrepancy between projected and actual building energy consumption.

Energy model calibration is the process of adjusting a set of inputs to reach a desired output and minimizing the difference between the modeled versus measured data for a building. However, the traditional model calibration approaches are time consuming, labor-intensive, and expensive because energy analysts/modelers need to manually adjust numerous model inputs in trial-and-error approach. In addition, there may be insufficient data from existing buildings to create an accurate and predictive energy model. In many cases, drawing sets may be missing or insufficient and specifications of their systems and equipment may not be easily be found. This can make calibration process more arduous. Monthly utility data is the most common data available from existing buildings, but even that dataset includes missing values and anomalies. Also, input uncertainties in building energy modeling are inevitable, but little information is available to inform practitioners of strategically selecting representative inputs.

Furthermore, the existing calibration processes are computationally expensive, meaning they require significant time and/or expensive resources such as supercomputers to run hundreds or thousands of parametric simulations for various model inputs.

Accordingly, there is a need for identifying an automated process for calibrating energy models that is computationally efficient. Furthermore, there is a need for an improved system for leveraging user expertise to reduce the number of simulation iterations and remove the unrealistic inputs and results. In addition, there is a need for integration of originally separate datasets and processes for enhanced quality of the calibration process.

SUMMARY

The following description presents a simplified summary in order to provide a basic understanding of some aspects described herein. This summary is not an extensive overview of the claimed subject matter. It is intended to neither identify key or critical elements of the claimed subject matter nor delineate the scope thereof.

In some embodiments, systems for calibrating building energy models may be provided. In some embodiments, a system may include one or more processors and a memory storing instructions. The system may be configured to: obtain a first building energy model for a building; obtain historical energy consumption data for the building. The system may be further configured to generate plurality of sensitivity values each of which corresponds to a respective variable of a plurality of variables. In some embodiments, generating the plurality of sensitivity values may include, for each of the plurality of variables, determining a respective sensitivity value that indicates a sensitivity of an output of the first building energy model to variations in the respective variable. The system may be further configured to, based on the plurality of variables and the plurality of sensitivity values, generate a second building energy model for the building. The second building energy model may include the plurality of variables and may be more computationally efficient than the first building energy model. The system may be configured to tune the second building energy model by modifying one or more of the plurality of variables and/or one or one or more of the plurality of sensitivity values based on the historical energy consumption data for the building.

In some embodiments, methods for calibrating building energy models may be provided. In some embodiments, a method may include obtaining a first building energy model for a building; obtaining historical energy consumption data for the building; generating plurality of sensitivity values each of which corresponds to a respective variable of a plurality of variables, the step of generating the plurality of sensitivity values comprising, for each of the plurality of variables, determining a respective sensitivity value that indicates a sensitivity of an output of the first building energy model to variations in the respective variable; based on the plurality of variables and the plurality of sensitivity values, generating a second building energy model for the building, the second building energy model comprising the plurality of variables and being more computationally efficient than the first building energy model; and tuning the second building energy model by modifying one or more of the plurality of variables and/or one or one or more of the plurality of sensitivity values based on the historical energy consumption data for the building.

Further variations encompassed within the systems and methods are described in the detailed description of the invention below.

BRIEF DESCRIPTION OF THE DRAWINGS

The accompanying drawings, which are incorporated herein and form part of the specification, illustrate various, non-limiting embodiments of the present invention. In the drawings, like reference numbers indicate identical or functionally similar elements.

FIG. 6. shows an exemplary table that may be used as a graphical representation to the users to check and validate calibrated parameters.

FIGS. 7A-7D and FIGS. 8A-8C show historical and model data for an exemplary building.

DETAILED DESCRIPTION

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Figure 1:
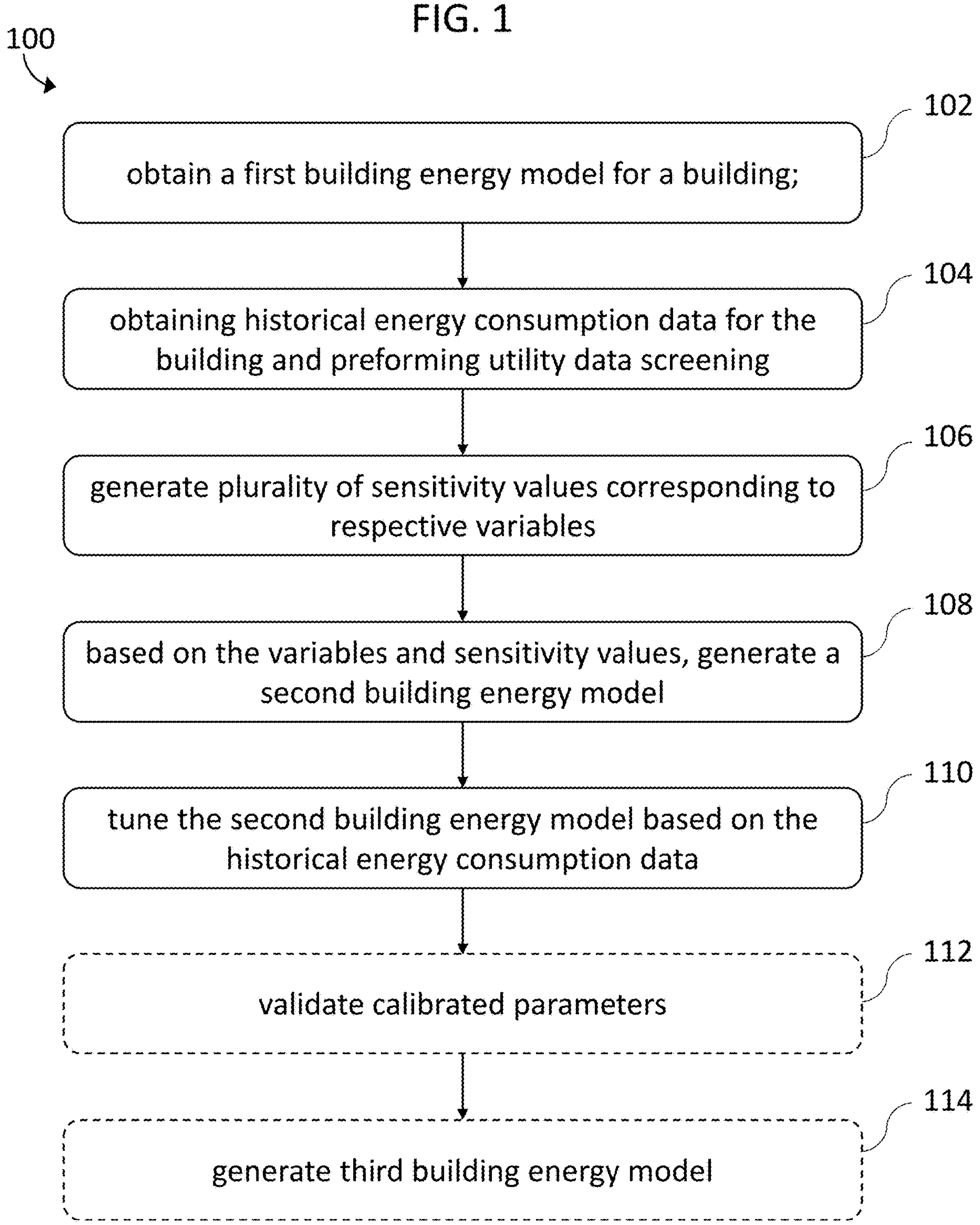
FIG. 1 shows an exemplary method for calibrating building energy models.

FIG. 1 shows an exemplary method 100 for calibrating building energy models. In some embodiments, method 100 may be performed by a system that includes one or more processors and one or more memories storing computer-readable instructions. For example, method 100 may be performed using any of the systems described below, including those described in FIG. 2.

In step 102, a first building energy model may be obtained. In some embodiments, the first building energy model may be a physics-based building energy model. For example, the first building energy model may contain three-dimensional coordinates for a plurality of objects or structures that relate to the building's energy consumption, and the first building energy model may estimate the building's energy consumption based on modeled physical processes relating to these objects and structures. As used herein, the term "building energy model" includes physics-based equations, or other tools that can be used to predict energy consumption for a building. In some embodiments, the first building energy model may be an EnergyPlus™ model (EnergyPlus software is published by the United States Department of Energy). Other suitable building energy models may be used. In some embodiments, the system may generate the first building energy model. In other embodiments, the system may receive a first building energy via a server with access to a wide area network such as the internet.

In step 104, historical consumption of data may be obtained. Energy consumption may be reported for electricity and/or natural gas consumption in the format of, e.g., weekly, monthly, or quarterly data. A data screening process may optionally be performed at this step to remove anomalies, account for data gaps or fill those gaps using interpolation, and to create a representative year that best reflects the energy consumption of the building. An example of a data screening process 300 that may be used in step 104 is described below with respect to FIG. 3.

In step 106, a plurality of sensitivity values corresponding to respective variables may be generated by using the first building energy model. In this process, the first building energy model's variables are changed within a reasonable range of data.

For example, a large number of energy simulation runs may be created by changing the model inputs within a range. In some embodiments, each model input may have a respective range that is specified by a user. In other embodiments, the ranges may be automatically generated based on statistical data aggregated from prior models or buildings. In some embodiments, the system may generate random selection of values within specified ranges for each input parameter in the energy model and may record them in a data matrix. The data matrix may contain values of selected input parameters in each row and may change the corresponding input parameter values to generate a modified version of the first model. A large number of modified versions of the first model (e.g., more than 10, more than 50, more than 100, more than 200, more than 300, more than 500, or more than 1,000) may be generated by repeating this process. In this way, a large range of possible scenarios of building configuration may be generated.

Each modified version of the first model may be used to generate simulation outputs relating to energy-related values such as monthly electricity and natural gas consumption. These outputs may be stored in a structured database or file.

Figure 5:
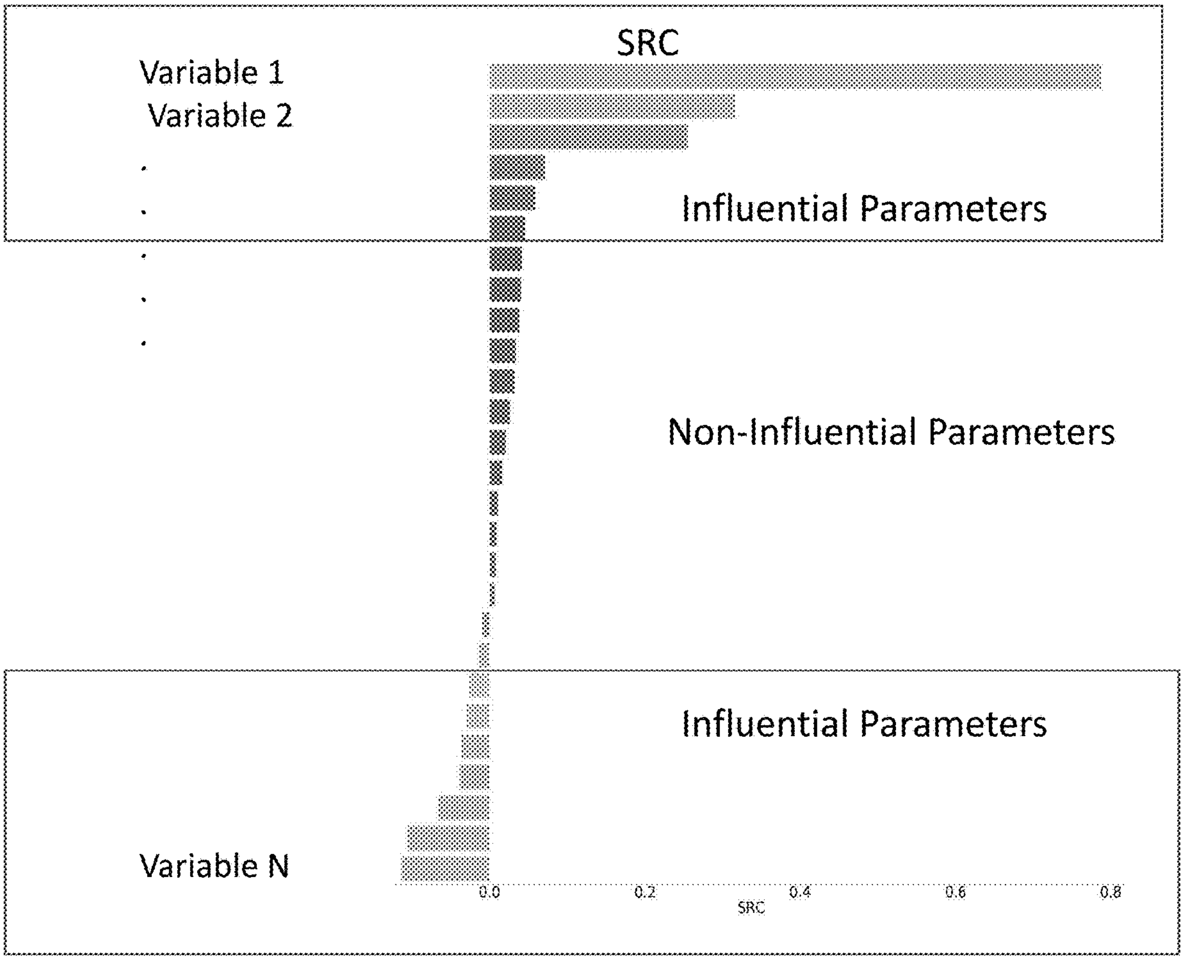
FIG. 5 shows an exemplary chart of sensitivity values for parameters in a building energy model.

A physics-based energy model can contain hundreds or thousands of parameters depending on building size, making it challenging to fine-tune each parameter. A sensitivity analysis as described in step 106 may be used to identify the most critical parameters affecting the building energy consumption. In some embodiments, regression-based methods may be used for sensitivity analysis. In a regression-based approach, one or more model outputs or responses may be approximated to a linear relationship between the sum-product of each independent variable and its regression coefficient. The coefficients represent the relative importance of the corresponding input parameter. In some embodiments, standardized regression coefficients (SRC) may be used, which may reduce computational cost while maintaining acceptably high accuracy for linear and partly linear relationships. FIG. 5 shows examples of SRC rates generated for exemplary input variables.

The output of the sensitivity analysis performed in step 106 may be a plurality of model variables, where each of the plurality of variables has a respective sensitivity value that indicates the sensitivity of the model output(s) to changes in the model variable. In some embodiments, the sensitivity values may be variance measures. For example, the output may include a first variance measure for a first variable of the first building energy model, a second variance measure for a second variable of the first building energy model, a third variance measure for a third variable of the first building energy model, and so on for some or all of the variables of the first building energy model.

In step 108, a second building energy model may be generated based on the variables and sensitivity values determined in step 106. In some embodiments, the second building energy model may be a surrogate model that accurately represents the first building energy model. The second building energy model may be referred to herein as a "metamodel."

In some embodiments, the second building energy may be developed using machine learning algorithms. For example, supervised learning algorithms such as regression may be used to predict the monthly electricity and natural gas consumption. The large quantity of data generated from the simulations performed in step 106 may be used for model training. The following regression methods may be used: simple multi-linear regression (MLR), polynomial regression (PR), support vector machines (SVM), stochastic gradient descent regression (SGD), random Forest regression (RF), extreme gradient boosting technique (XG-Boost), multivariate adaptive regression splines (MARS), and ridge regression.

The second building energy model may be a closed form equation that includes a plurality of coefficients determined via the sensitivity analysis in step 106 and a plurality of variables that represent parameters related to a building's energy consumption. For example, the second building energy model may be represented by an equation according to the form shown below:

$$\text{Month 1 Energy Consumption} = \text{metamodel } 1 = K_1 \cdot X_1 + K_2 \cdot X_2 + K_3 \cdot X_3 + \ldots + K_n \cdot X_n$$

where $K_n$ represents a sensitivity coefficient for a model variable and $X_n$ represents the respective variable.

$$\text{Total Annual Energy Consumption} = \text{metamodel } 1 + \text{metamodel } 2 + \ldots + \text{metamodel } 12$$

The output variables from step 108 may be monthly energy consumption and total annual energy consumption. One metamodel is generated for each month, and the sum of all 12 metamodels generate the total annual energy consumption. The R squared ($R^2$) value, which is a measure that provides information about the goodness of fit of the model, was used as the accuracy indicator between metamodel output and EnergyPlus output. The best algorithm for generating metamodel was selected based on the comparison of $R^2$ values. Whereas the first building energy model may contain a large number of variables (e.g., hundreds), the second building energy model may preferably include only a subset of variables with relatively large sensitivity coefficients. For example, the system may sort the variables according to the magnitudes of their sensitivity coefficients, and select only N of the variables having the highest-magnitude sensitivity coefficients, where N is a number of variables to be included in the second building energy model. In some embodiments, N may be less than or equal to ten, less than or equal to twenty, less than or equal to thirty, less than or equal to forty, less than or equal to fifty, less than or equal to seventy, or less than or equal to one-hundred.

In step 110, the second building energy model may be tuned based on historical energy consumption data. For example, values may be assigned to the variables in the second energy model, and the output(s) from the second building energy model may be compared to historical data. These variations of the second building energy model may be generated and the difference between the measured data from the actual building (e.g., the building's historical electricity and natural gas consumption data) and the simulated data (e.g., the second energy model's monthly energy consumption outputs) are recorded. Instances with a minimal difference between the actual energy consumption data and the simulated results may be selected for use or for further analysis.

Buildings may have more than one fuel type, such as electricity, natural gas, and oil. In some embodiments, an objective function may be defined to indicate a difference between an output of the second building energy model and a total energy consumption for the building, including all fuel types. In some embodiments, total energy consumption values for the building may be determined on a weekly, monthly, quarterly, or annual basis by combining or analyzing historical energy consumption data for each of the fuel types consumed by the building.

In some embodiments, metrics for testing calibrated models defined by the American Society of Heating, Refrigeration and Air-conditioning Engineers (ASHRAE) Guideline 14 (ASHRAE 2014) may be used. These metrics may include the coefficient of variation of the root-mean-squared error (CV(RMSE)), the normalized mean-bias error (NMBE), and the goodness of fit (GOF), which uses weights to combine the CV(RMSE) and NMBE into a single equation (ASHRAE 2014). In some embodiments, all three of these metrics may be used to assess the accuracy of the second building energy model.

Coefficient of variation of the root mean squared error (CV(RMSE)) is the coefficient of variability or instability of the predicted input series relative to the observed or measured input series. As applied to the building energy model calibration techniques described herein, this index can be used to indicate how well a calibrated model fits the actual data by measuring the offsetting errors between the model predictions and the actual energy consumption. It may measure the variation of errors between the measured and simulated data and indicates the model's ability to match the overall load shape of the actual energy consumption. The CV(RMSE) is defined mathematically as:

$$CV(RMSE) = \frac{1}{\overline{m}}\sqrt{\frac{\sum_{i=1}^{n}(m_i - s_i)^2}{n-p}} \times 100(\%) \quad 4$$

Where m_i is the measured value, s_i is the simulated or model prediction, n is the number of data points, p is set to 1, and $\overline{m}$ is the average of all measured values.

Normalized Mean-bias Error (NMBE) may scale the results of the MBE and allows comparison. The Mean-bias error represents the average/overall error between the actual and predicted energy consumption over the sample space. MBE is a good indicator of the overall bias of the model and averages the behavior of the simulated model with respect to the regression line used in model fitting. NMBE introduces its scaling or normalization by dividing the result of the MBE by the average of the measured inputs. Despite the robust nature of the NMBE, it is subject to the cancelation effect, where positive bias accounts for negative bias in its computation. It is practical to combine the NMBE with another evaluation metric when calibrating. The NMBE is defined mathematically as follows:

$$NMBE = \frac{1}{\overline{m}} \times \frac{\sum_{i=1}^{n}(m_i - s_i)}{n-p} \times 100(\%) \quad 5$$

Similarly, for NMBE calculation, p is often set to 1.

Goodness of Fit (GOF) may be determined using NMBE and/or CV(RMSE). A GOF function may combine both statistical indices into one function for measuring the overall behavior of how the simulated values fit the measured or actual ones. The lower the values of the GOF obtained, the more closely the simulated values match the measured data. A GOF function may be defined mathematically as:

$$GOF = \frac{\sqrt{2}}{2} \times \sqrt{CV(RMSE)^2 + NMBE^2} \quad 6$$

ASHRAE Guideline 14 requires a successfully calibrated model with a maximum NMBE of 5% and a maximum CV(RMSE) of 15% relative to monthly calibration data (ASHRAE 2014).

A multiobjective calculation may be applied to determine values that minimize the GOF for both electricity and natural gas by varying the input parameters to metamodels. Two exemplary objective functions are defined in Equations 7 and 8 below:

$$F_1 = GOF_{Elec}(\text{measured cosumption, model predicted consumption}) \quad 7$$

$$F_2 = GOF_{Gas}(\text{measured cosumption, model predicted consumption}) \quad 8$$

The calculation may be unconstrained and bounded by each selected input parameter's maximum and minimum values in metamodels. Exemplary multiobjective calculation algorithms that may be used include the non-dominated sorting genetic algorithm (NSGA-II), referenced non-dominated sorting genetic algorithm (R-NSGA-II), the multiobjective evolutionary algorithm by decomposition (MOEA/D), and the adaptive geometry estimation based multiobjective evolutionary algorithm (AGE-MOEA).

Ten-fold cross-validation and grid-search may be used to estimate the generalization performance of the models and seek out the best hyperparameters for each metamodel.

The outputs from step 110 may include a plurality of values including at least one selected value for each variable included in the second building energy model. Preferably, the selected values are tuned to minimize a difference between outputs of the second building energy model and historical energy consumption data.

In this step, the second energy model(s) that resulted in the minimal difference with the actual historical data may be recorded. The model may then be applied for energy modeling, or its parameters may be extracted and inputted to another model (e.g., a physics-based model). Optionally, the second energy model may be subjected to a user-validation process before its parameters are accepted, as described below with respect to step 112.

In optional step 112, the variable values selected in step 110 may be displayed to a user via a display, and inputs may be received from the user related to the user's assess accuracy of the selected values. In this step, the best one or more solutions (e.g., calibrated input parameters) generated from step 110 may be presented to the user for review. Users may see the input parameters resulting from step 110 in a visual representation with their associated levels of error (e.g., CV(RMSE), NMBE, goodness of fit, or other statistical measures may be displayed). Users may be able to select the input parameters that are most associated with the building physics and remove parameters that are known to the user to be unlikely to be accurate given their knowledge of the building. FIG. 6. shows exemplary variables that may be displayed to a user in a table during this step.

The system may display a prompt for a user to provide a user-defined range for a first variable of the plurality of variables and receive the user-defined range for the first variable of the plurality of variables. This process may be repeated for some or all of the variables in the second building energy model. In some embodiments, user-defined ranges may be specified before the calibration step 110, and the system may assign values for the variables solely within the user-defined ranges where such ranges are specified.

In optional step 114, the calibrated input parameters selected in step 112 may be imported to a (optionally, physics-based) model, thereby generating a third building energy model. In some embodiments, the third building energy model may be generated by importing the selected parameters from the second building energy model into the first building energy model, thereby defining a new building energy model with accurately calibrated parameters. The third building energy model may then be applied. For example, the third building energy model may be used to predict energy savings resulting from potential building improvement projects.

Figure 2:
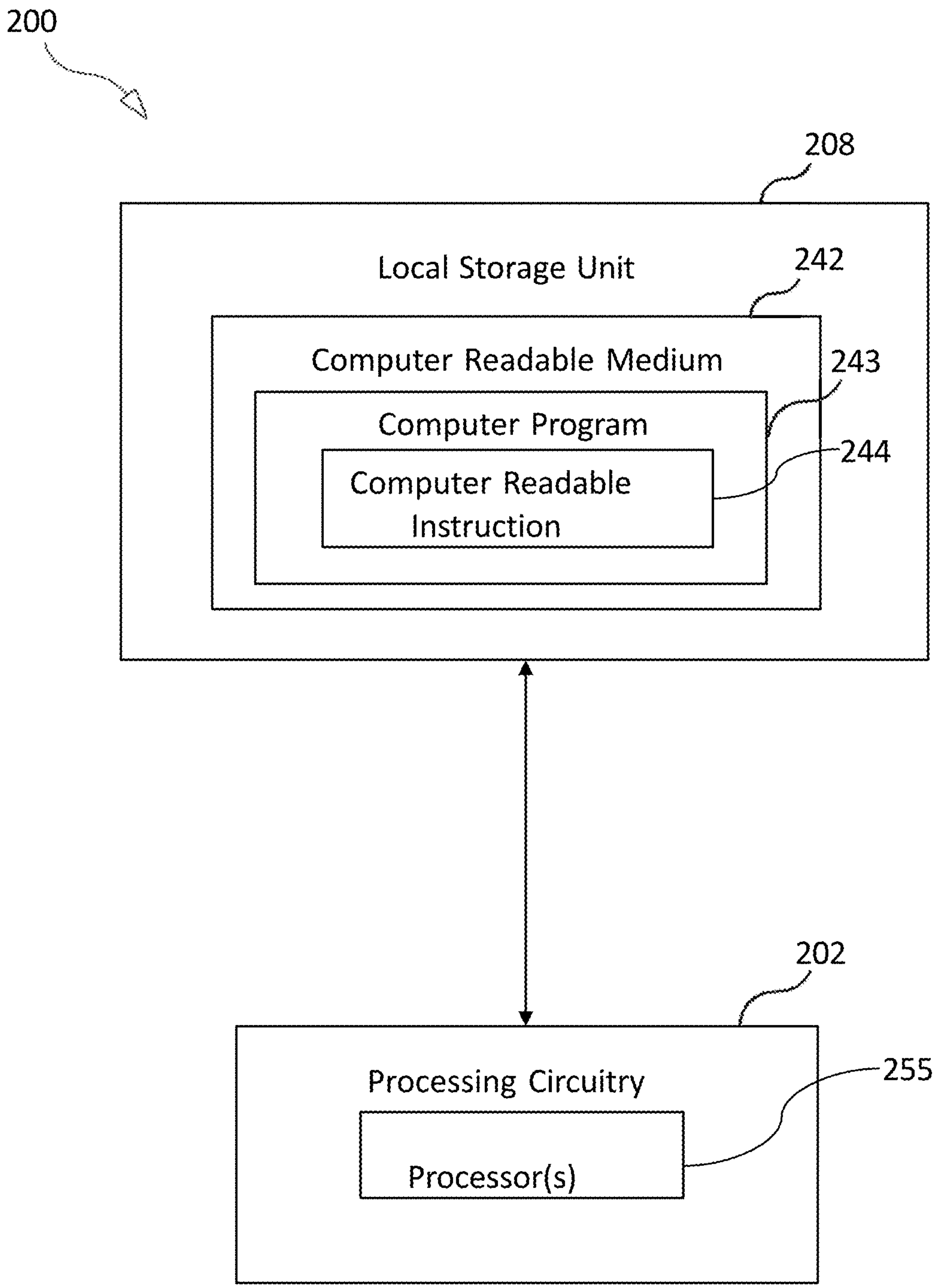
FIG. 2 shows an exemplary system for performing the methods described herein.

FIG. 2 shows an exemplary system 200 capable of performing the methods described herein, including the method described above with respect to FIG. 1 and the methods described below with respect to FIG. 3. As shown in FIG. 2, system 200 may include: processing circuitry (PC) 202, which may include one or more processors (P) 255 (e.g., one or more general purpose microprocessors and/or one or more other processors, such as an application specific integrated circuit (ASIC), field-programmable gate arrays (FPGAs), and the like); and a local storage unit (a.k.a., "data storage system") 208, which may include one or more non-volatile storage devices and/or one or more volatile storage devices. System 200 may further comprise a computer readable medium 242 storing a computer program (CP) 243 comprising computer readable instructions (CRI) 244. CRM 242 may be a non-transitory computer readable medium, such as, magnetic media (e.g., a hard disk), optical media, memory devices (e.g., random access memory, flash memory), and the like. In some embodiments, the CRI 244 of computer program 243 may be configured such that when executed by PC 202, the CRI causes system 200 to perform any of the methods and processes described herein (e.g., steps described herein with reference to the flow charts).

Figure 3:
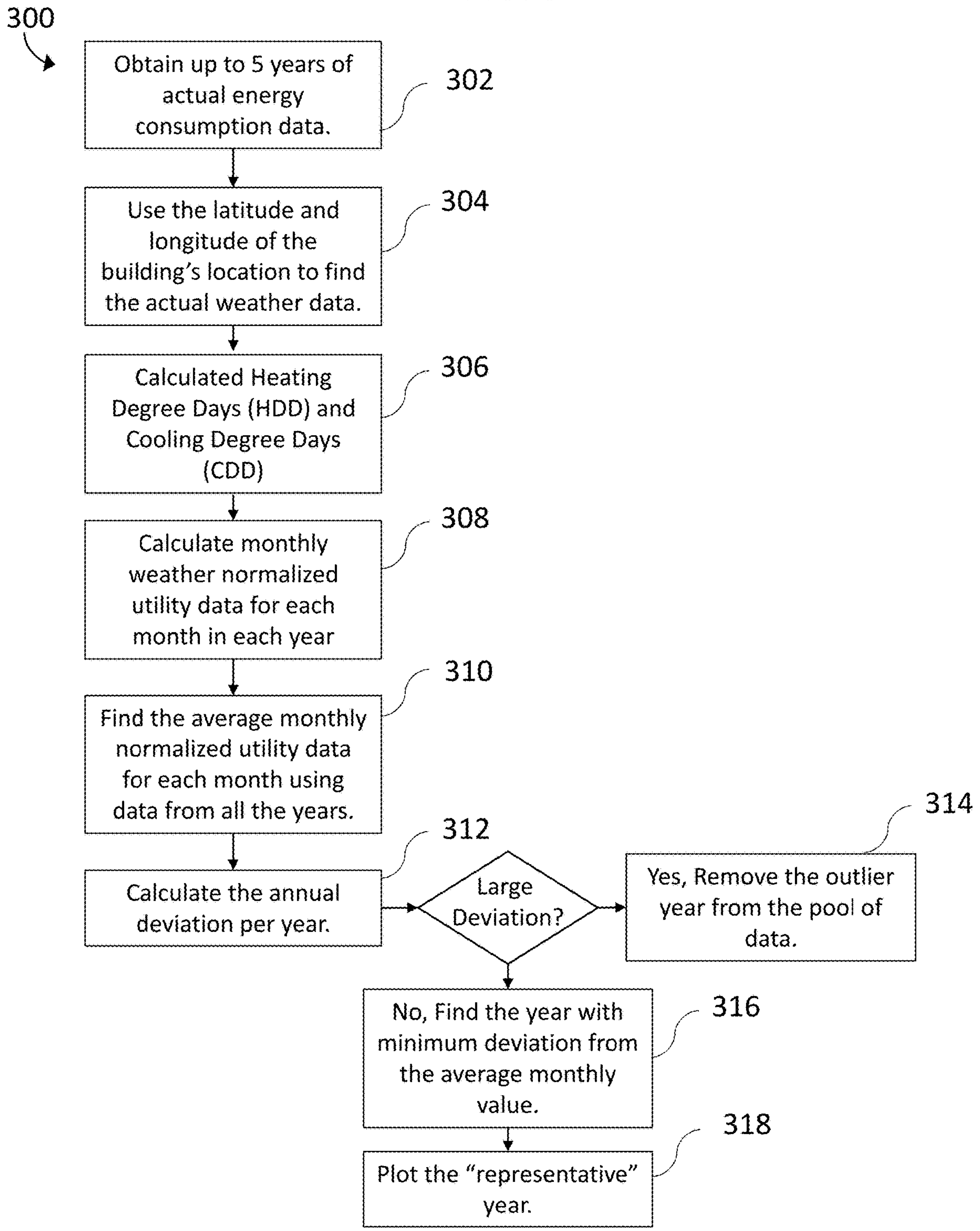
FIG. 3 shows an exemplary method for processing historical energy consumption data.

FIG. 3 shows an exemplary method 300 for processing historical energy consumption data. In some embodiments, weather-normalized utility data may be used to remove the impact of weather on the consumption data.

In step 302, the system may obtain a set of historical building energy consumption data. This may, for example, be in the format of a CSV file that includes 12 data points for monthly electricity and/or gas consumption separately using the same units of energy (e.g., kBtu, kWh). The utility data could include up to 5 or more years of data.

In step 304, local weather data may be obtained for the building's location. For example, the building's location (e.g., latitude and longitude) may be used to find the nearest weather station to download historical weather data in that location. This may be obtained, for example, from the National Oceanic and Atmospheric Administration (NOAA) database.

In step 306, a baseline temperature (e.g., 65° F. or 18 C) may be used to define the Heating Degree Days (HDD) and Cooling Degree Days (CDD) compared to the outdoor dry bulb temperature from the historical weather data of the selected location. HDD may be determined by summing degrees in excess of the baseline temperature for each day where an average temperature is above the baseline temperature. CDD may be determined by summing degrees below the baseline temperature for each day where an average temperature is below the baseline temperature. Then calculated HDD and CDD may be added together.

In step 308, monthly weather-normalized utility data for each month in each year may be calculated by dividing the monthly energy consumption data by the sum of HDD and CDD. In step 310, the monthly normalized utility data may be averaged for each month using data for a single month (e.g., January) for all years. In step 312, the average normalized utility data per month may be compared with the actual energy consumption in that month for each year. The sum of 12 monthly deviations may be calculated for each year.

In step 314, if the deviation is large for a year (or for multiple years), that year may be assessed as an outlier and the data from that year and may be removed from the pool. In step 316, the year with the minimum deviation may be determined as the "representative year". In step 318, the "representative year's" monthly consumption data may be plotted. Other data screening processes may be used, as will be understood by those of skill in the art.

Figure 4A:
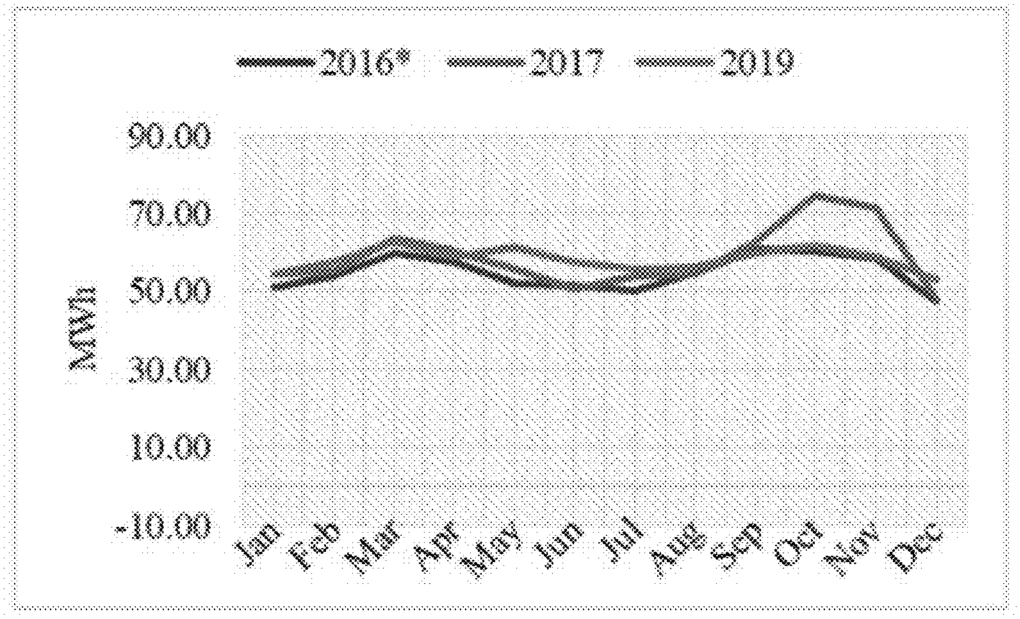
FIGS. 4A and 4B show exemplary charts of historical building energy consumption.
Figure 4B:
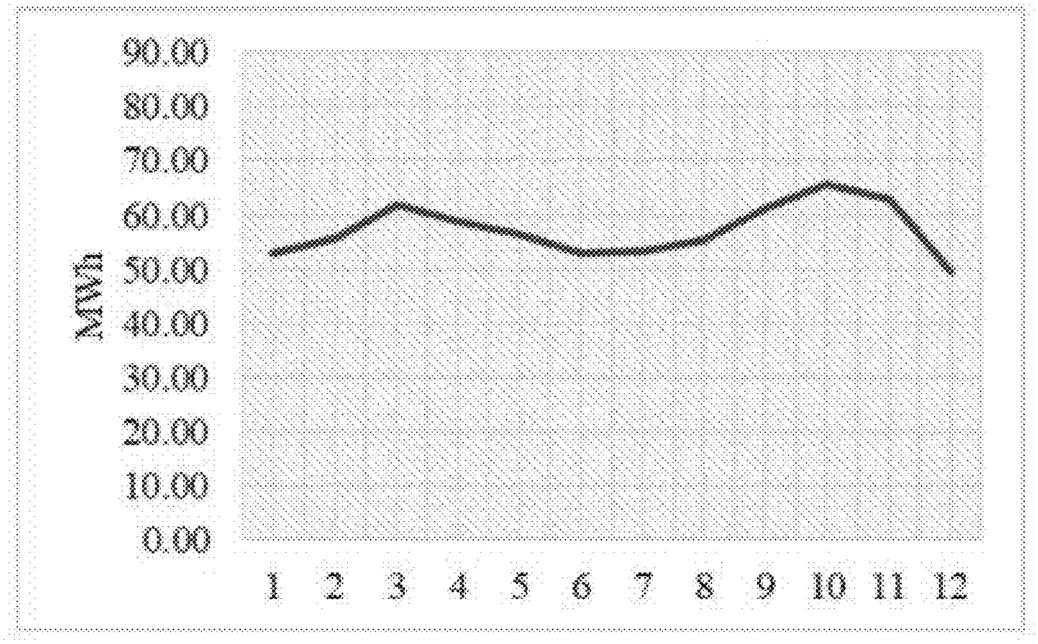

FIGS. 4A and 4B show exemplary charts of historical building energy consumption. FIG. 4A shows a monthly plot of energy consumption data (e.g., extracted from utility data) over three years. FIG. 4B shows a monthly plot of a representative year, which has been determined from the data shown in FIG. 4A using the process described above with respect to FIG. 3.

FIG. 5 shows an exemplary chart of sensitivity values for parameters in a building energy model. As shown in FIG. 5, parameters with relatively large magnitudes (whether positive or negative) may be selected for inclusion in a simplified model (e.g., the second building energy model). To improve computational efficiency, parameters with low magnitudes may be omitted from the model. In some embodiments, the sensitivity values may be standardized regression coefficients (SRC). The SRC represents the number of standard deviations a dependent variable will change per standard deviation increase in the independent variable. An SRC for each of the model parameters may be calculated by fitting a multi-linear model between the standardized dependent and independent variables, as shown in the equation below:

$$\hat{y} = \beta_0 + \sum_{i=1}^{n} \beta_i x_i$$

The regression coefficients $\beta_0$ and $\beta_i$ can be determined from the Least Squares Method. It should be noted that the regression coefficients $\beta_0$ and $\beta_i$ are dependent on the units of $\hat{y}$ and $x_i$. Equation 1 can be re-arranged into a dimensionless format:

$$\frac{\hat{y} - \bar{y}}{\sigma_y} = \sum_{i=1}^{n} \frac{\beta_i \sigma_i}{\sigma_y} \cdot \frac{x_i - \bar{x}_i}{\sigma_i}$$

where $\bar{y}$ and $\sigma_y$ are the mean and standard deviation of the dependent variable, and $\bar{x}_i$ and $\sigma_i$ are the mean and standard deviation of the independent variables. The SRC for the independent variable $x_i$ is $$SRC_i = \frac{\beta_i \sigma_i}{\sigma_y}$$

By using a normalized sensitivity coefficient such as SRC, the system may scale the regression coefficients to reflect the difference between the spread of independent and dependent variables. Conversely, regression coefficients that depend on the unit and magnitude of inputs cannot be compared directly due to different scales. By standardizing the independent variables and multiplying the regression coefficients with the standard deviation ratio of the independent variable and dependent variable, the resulting SRCs for independent variables can advantageously be directly compared regardless of their original scales.

FIG. 6. shows an exemplary table that may be used as a graphical representation to the users to check and validate the calibrated parameters (variables) output from step 110. The table includes building energy model's input variables, (e.g., roof thermal resistance, glazing Solar Heat Gain Coefficient, and etc.), their units, ranges (minimum and maximum values), original value in the first energy model, and their associated values resulted from step 110. A plurality (e.g., three) best solutions resulting from step 110 may be displayed and compared with each other. In addition, for each calibrated solution, the validation metrics (e.g., CV(RMSE), NMBE, GOF, etc.) associated with each calibrated solution may be presented in this table.

FIGS. 7A-7D and FIGS. 8A-8C show historical and model data for an exemplary building. Automated calibrations were performed using the methods described herein to improve upon an EnergyPlus model for this building. This table shows electricity, heating, and cooling energy consumption from the actual data (measurements), a second energy model (metamodel), and a third energy model (in this case, an EnergyPlus model that has been modified using the metamodel).

Figure 7B:
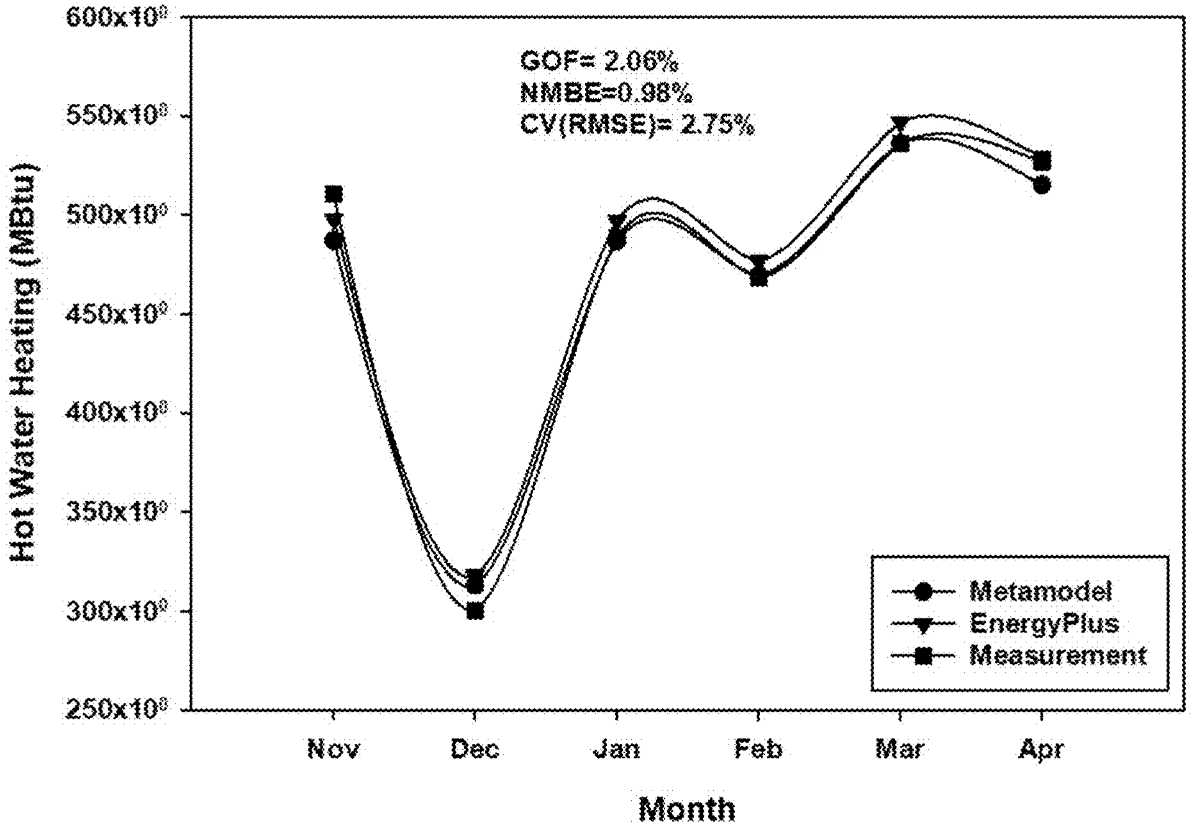

The actual heating and cooling energy of the building were determined from the measurements of volumetric flow and temperatures of chilled and hot water. The 5-min interval data were processed to obtain the monthly heating and cooling energy. The monthly electricity consumption were average of monthly data in 2016, 2017, and 2019 that were determined from the 15-min interval smart meter data. The simulation period was from November 1st to April 27th due to the availability of heating and cooling data. FIG. 7B. compares the heating energy consumption in the second energy model (metamodel), third energy model, and actual energy consumption (measurement) with performance indexes of GOF, CV(RMSE), and NMBE.

Figure 7C:
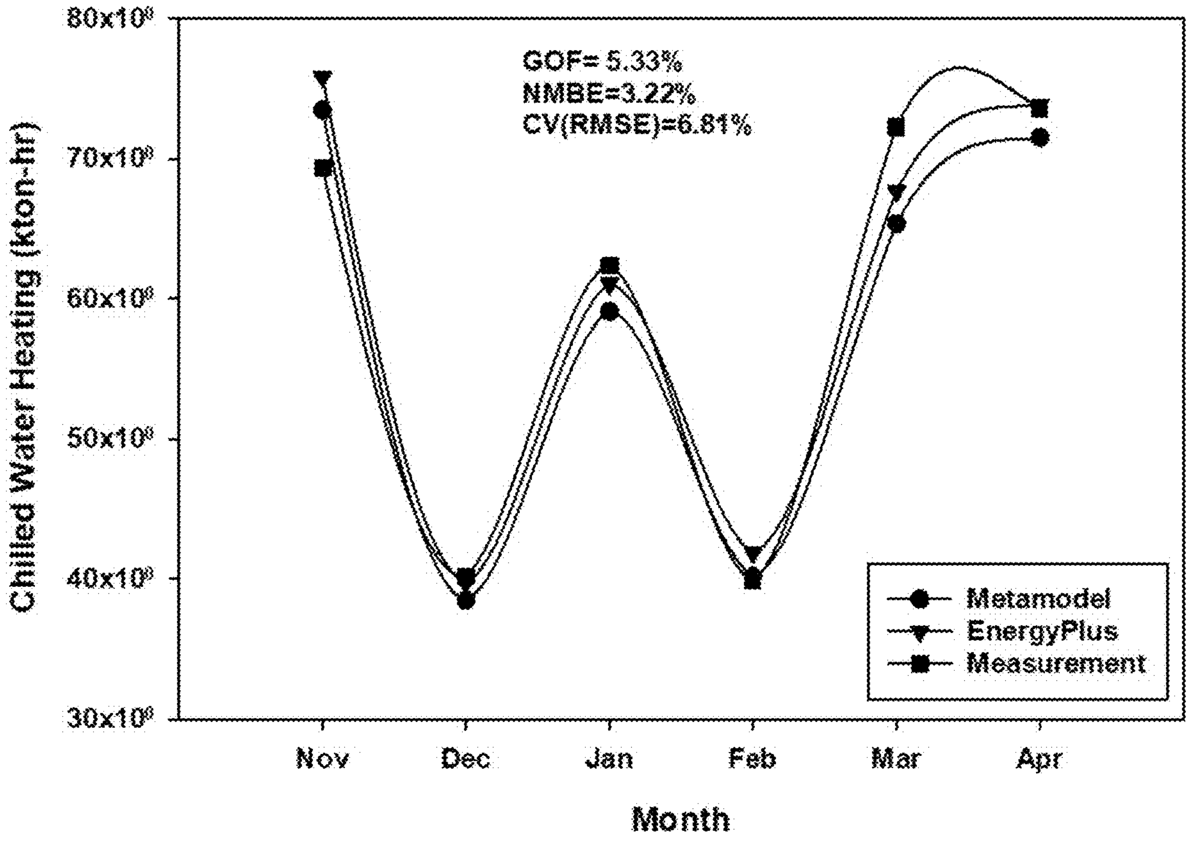

FIG. 7C compares the cooling energy consumption in the second energy model (metamodel), third energy model (EnergyPlus), and actual energy consumption (measurement) with performance indexes of GOF, CV(RMSE), and NMBE.

Figure 7D:
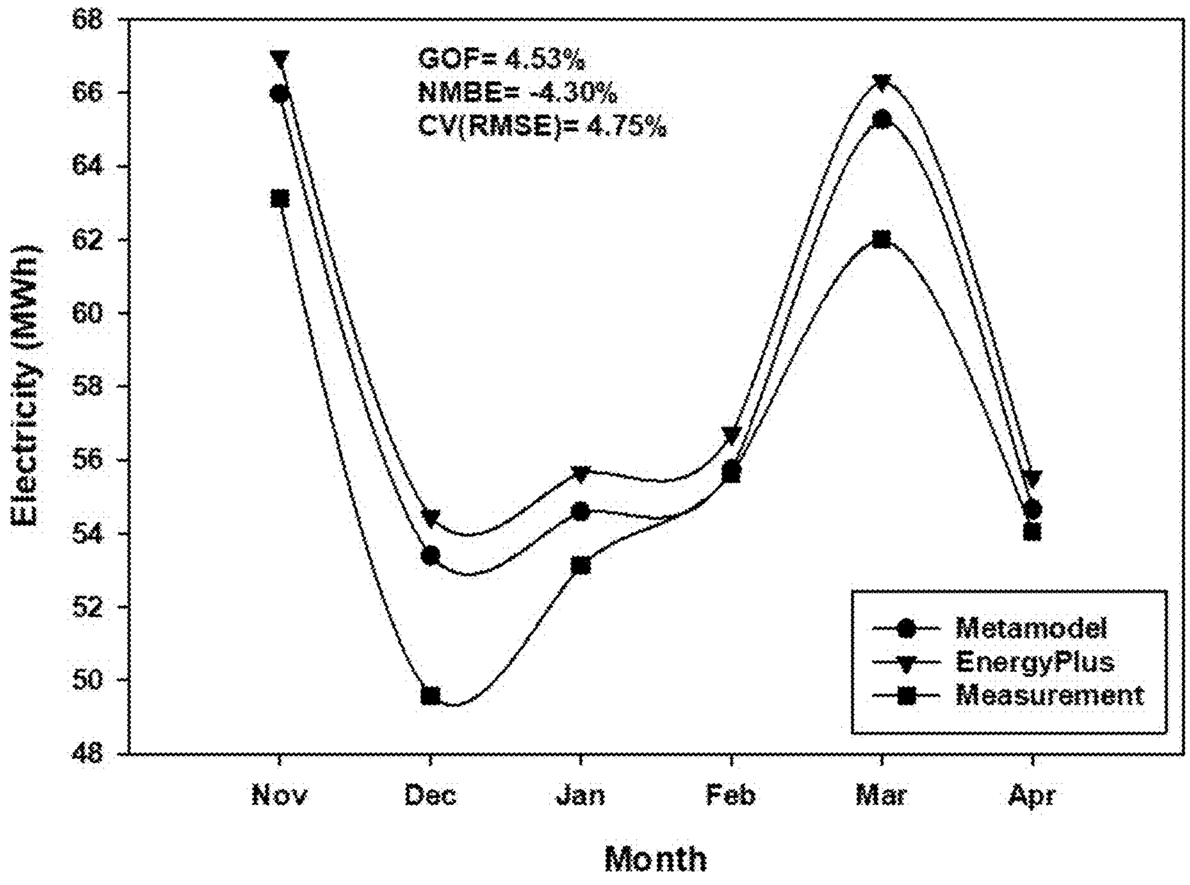

FIG. 7D. compares the electricity energy consumption in the second energy model (metamodel), third energy model (EnergyPlus), and actual energy consumption (measurement) with performance indexes of GOF, CV(RMSE), and NMBE.

Figure 8A:
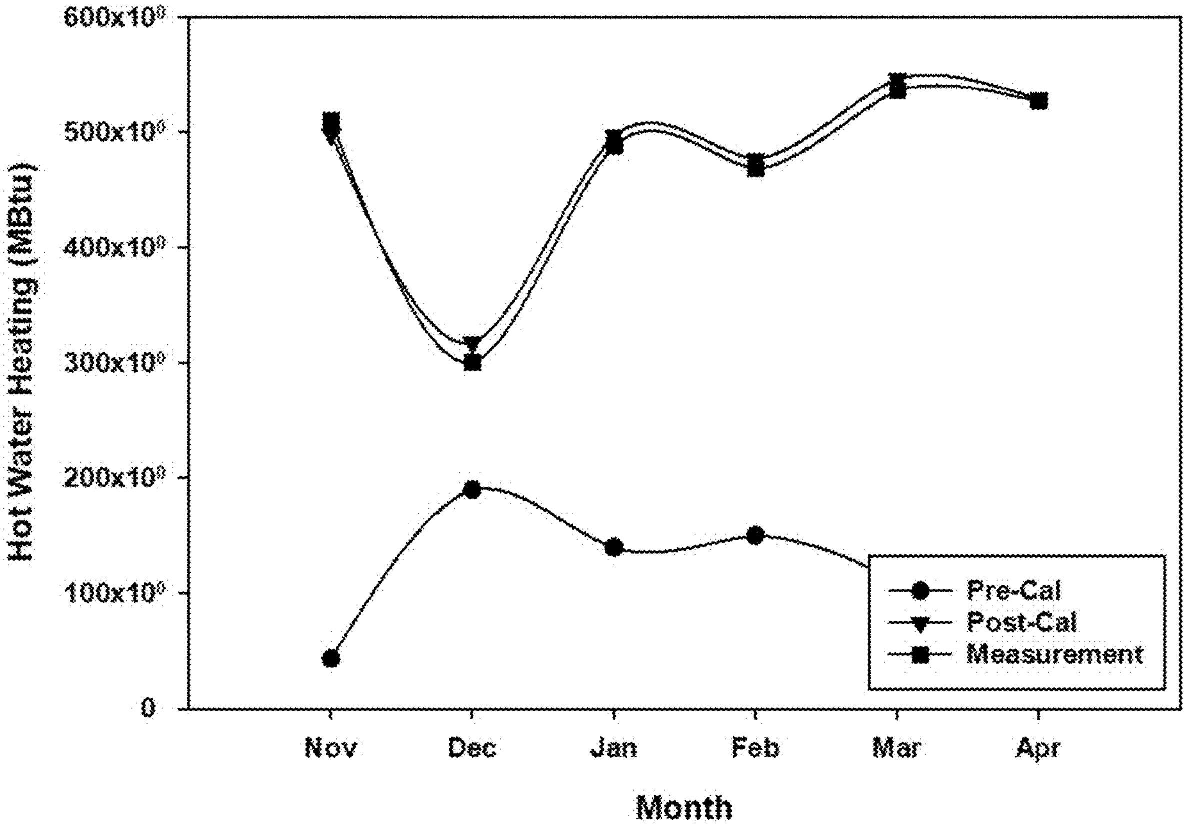
Figure 8B:
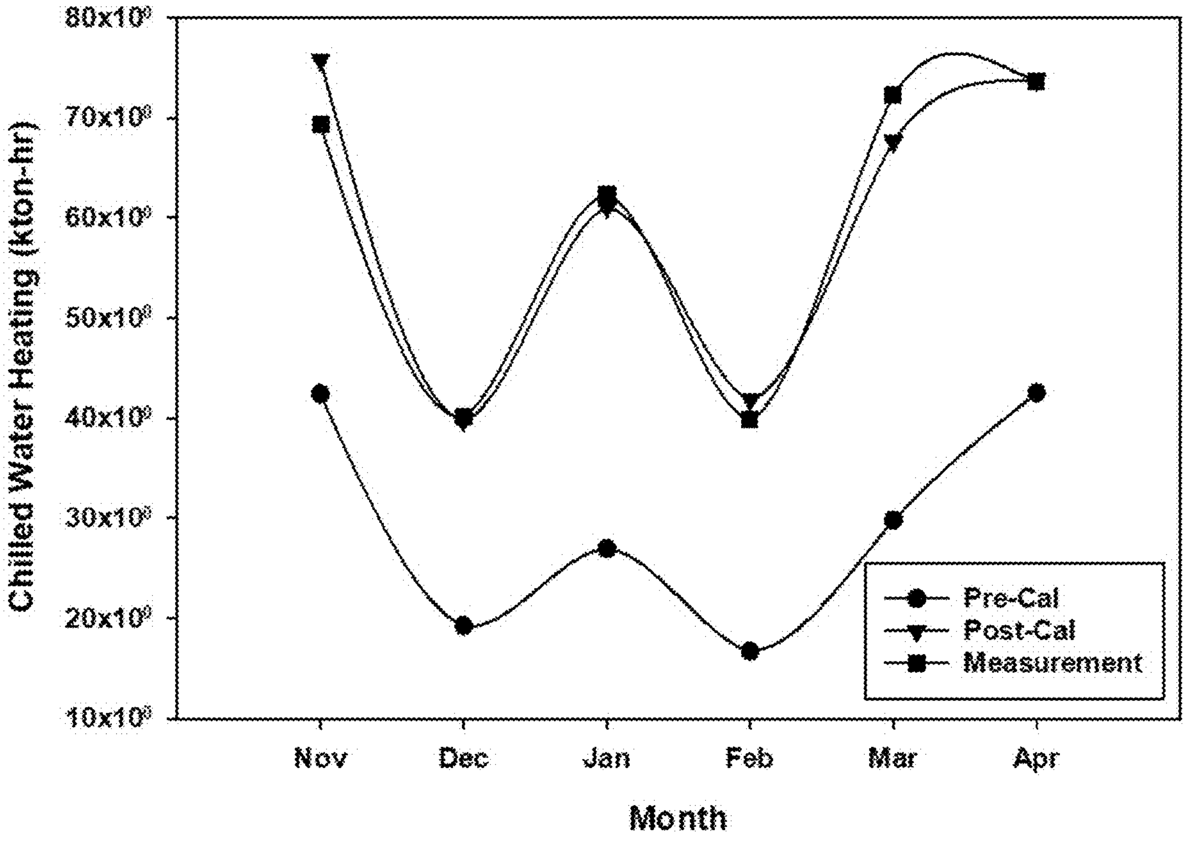
Figure 8C:
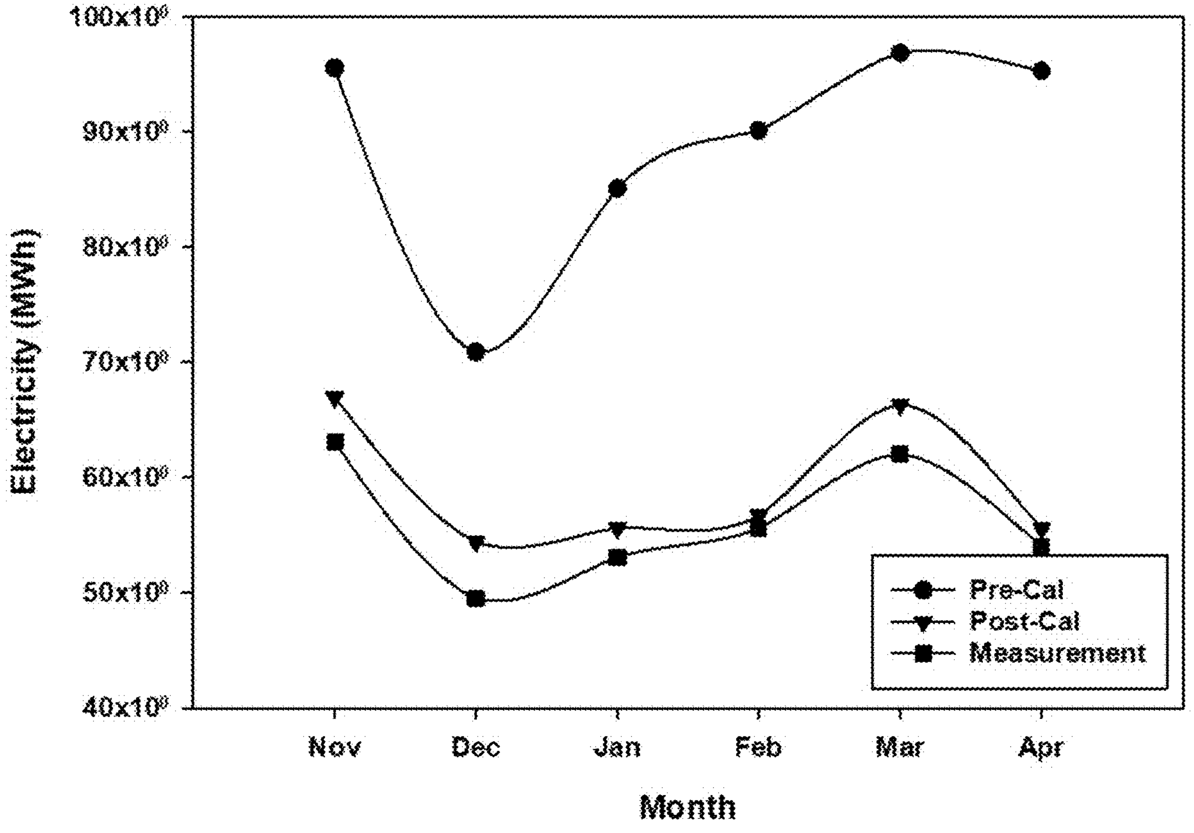

FIGS. 8A-8C show improvements in predictive accuracy using the methods described herein. FIG. 8A. compares the pre calibration and post calibration results of heating energy consumption using the automated calibration process described herein. While the label "Pre-Cal" refers to the first energy model, the label "Post-Cal" refers to the third energy model after automatic calibration.

FIG. 8B. compares the pre calibration (first energy model) and post calibration (third energy model) results of cooling energy consumption using the automated calibration process described herein.

FIG. 8C. compares the pre calibration (first energy model) and post calibration (third energy model) results of electricity energy consumption using the automated calibration process described herein. As shown in FIGS. 8A-8C, the methods described herein substantially improve the predictive accuracy of a building energy model and achieve this improvement with improved computational efficiency relative to prior approaches for building energy model calibration.

While various embodiments are described herein, it should be understood that they have been presented by way of example only, and not limitation. Thus, the breadth and scope of this disclosure should not be limited by any of the above described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this is solely for the sake of illustration. Accordingly, it is contemplated that some steps may be added, some steps may be omitted, the order of the steps may be re-arranged, and some steps may be performed in parallel.

The invention claimed is:

1. A system for calibrating building energy models, the system comprising:

one or more processors; and a memory storing instructions that, when executed by the one or more processors, are configured to cause the system to:

obtain a first building energy model for a building;

obtain historical energy consumption data for the building;

generate plurality of sensitivity values each of which corresponds to a respective variable of a plurality of variables, the step of generating the plurality of sensitivity values comprising, for each of the plurality of variables, determining a respective sensitivity value that indicates a sensitivity of an output of the first building energy model to variations in the respective variable;

based on the plurality of variables and the plurality of sensitivity values, generate a second building energy model for the building, the second building energy model comprising the plurality of variables and being more computationally efficient than the first building energy model; and tune the second building energy model by modifying one or more of the plurality of variables and/or one or one or more of the plurality of sensitivity values based on the historical energy consumption data for the building, wherein, after the step of tuning the second building energy model, a predicted energy consumption generated by the second building energy model based on a set of values for the plurality of variables is within a tolerance of +/−5% of a predicted energy consumption generated by the first building energy model based on a same set of values for the plurality of variables.

2. The system of claim 1, wherein the step of tuning the second building energy model comprises minimizing a difference between one or more outputs of the second building energy and one or more values of the historical energy consumption data.

3. The system of claim 1, wherein:

the first building energy model is a physics-based building energy model;

the second building energy model is a closed form equation; and the plurality of variables indicate properties of the building that relate to the building's energy consumption.

4. The system of claim 3, wherein the step of tuning the second building energy model comprises:

generating a plurality of computations of the closed form equation in which one or more of the variables are assigned different values; and for each of the plurality of computations of the closed form equations, comparing a predicted energy consumption of the closed form equation based on the assigned values to the historical energy consumption data.

5. The system of claim 4, wherein the system is further configured to:

display a prompt for a user to provide a user-defined range for a first variable of the plurality of variables; and receive the user-defined range for the first variable of the plurality of variables;

wherein the step of generating the plurality of computations comprises assigning values for the first variable solely within the user-defined range.

6. The system of claim 3, wherein the step of tuning the second building energy model generates one or more tuned values for the plurality of variables, and the system is further configured to:

generate a third building energy model using the tuned values, the third building energy model being a physics-based building energy model.

7. The system of claim 3, wherein the second building energy model comprises less than fifty variables.

8. The system of claim 1, wherein the step of generating the plurality of sensitivity values comprises generating, using the first building energy model, a plurality of simulations in which at least a first variable of the plurality of variables is assigned different values.

9. The system of claim 8, wherein the step of generating the plurality of sensitivity values further comprises determining, based on the plurality of simulations, a first variance measure for the first variable and a second variance measure for a second variable of the plurality of variables, the first and second variance measures respectively indicating a variance of the output of the first building energy model in response to changes in the first variable and the second variable, respectively.

10. The system of claim 1, wherein the system is further configured to:

generate, based on the second building energy model, an estimated energy consumption savings for a proposed modification to the building.

11. A method for calibrating building energy models, the method comprising:

obtaining a first building energy model for a building;

obtaining historical energy consumption data for the building;

generating plurality of sensitivity values each of which corresponds to a respective variable of a plurality of variables, the step of generating the plurality of sensitivity values comprising, for each of the plurality of variables, determining a respective sensitivity value that indicates a sensitivity of an output of the first building energy model to variations in the respective variable;

based on the plurality of variables and the plurality of sensitivity values, generating a second building energy model for the building, the second building energy model comprising the plurality of variables and being more computationally efficient than the first building energy model; and tuning the second building energy model by modifying one or more of the plurality of variables and/or one or one or more of the plurality of sensitivity values based on the historical energy consumption data for the building, wherein, after the step of tuning the second building energy model, a predicted energy consumption generated by the second building energy model based on a set of values for the plurality of variables is within a tolerance of +/−5% of a predicted energy consumption generated by the first building energy model based on a same set of values for the plurality of variables.

12. The method of claim 11, wherein:

the first building energy model is a physics-based building energy model;

the second building energy model is a closed form equation; and the plurality of variables indicate properties of the building that relate to the building's energy consumption.

13. The method of claim 12, wherein the step of tuning the second building energy model comprises:

generating a plurality of computations of the closed form equation in which one or more of the variables are assigned different values; and for each of the plurality of computations of the closed form equations, comparing a predicted energy consumption of the closed form equation based on the assigned values to the historical energy consumption data.

14. The method of claim 13, further comprising:

displaying a prompt for a user to provide a user-defined range for a first variable of the plurality of variables; and receiving the user-defined range for the first variable of the plurality of variables;

wherein the step of generating the plurality of computations comprises assigning values for the first variable solely within the user-defined range.

15. The method of claim 12, wherein the step of tuning the second building energy model generates one or more tuned values for the plurality of variables, the method further comprising:

generating a third building energy model using the tuned values, the third building energy model being a physics-based building energy model.

16. The method of claim 11, wherein the step of generating the plurality of sensitivity values comprises generating, using the first building energy model, a plurality of simulations in which at least a first variable of the plurality of variables is assigned different values.

17. The method of claim 16, wherein the step of generating the plurality of sensitivity values further comprises determining, based on the plurality of simulations, a first variance measure for the first variable and a second variance measure for the output of the first building energy model.

18. The method of claim 11, wherein the method further comprises:

generating, based on the second building energy model, an estimated energy consumption savings for a proposed modification to the building.

* * * * *